United States Patent
Gorai et al.

(10) Patent No.: US 10,048,294 B2
(45) Date of Patent: Aug. 14, 2018

(54) CURRENT DETECTION DEVICE

(71) Applicant: HITACHI AUTOMOTIVE SYSTEMS, LTD., Ibaraki (JP)

(72) Inventors: Nobuaki Gorai, Hitachinaka (JP); Takeshi Kato, Hitachinaka (JP); Yoshiyuki Akiyama, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 0 days.

(21) Appl. No.: 15/319,658

(22) PCT Filed: Jun. 3, 2015

(86) PCT No.: PCT/JP2015/065966
§ 371 (c)(1),
(2) Date: Dec. 19, 2016

(87) PCT Pub. No.: WO2015/194370
PCT Pub. Date: Dec. 23, 2015

(65) Prior Publication Data
US 2017/0131329 A1  May 11, 2017

(30) Foreign Application Priority Data

Jun. 20, 2014  (JP) ................................. 2014-126929

(51) Int. Cl.
*G01R 33/02* (2006.01)
*G01R 15/20* (2006.01)
(52) U.S. Cl.
CPC ................................. *G01R 15/202* (2013.01)
(58) Field of Classification Search
CPC ............................ G01R 15/207; G01R 15/202
(Continued)

(56) References Cited

U.S. PATENT DOCUMENTS 7,663,358 B2 * 2/2010 Hashio ................. G01R 15/207
264/254
9,372,240 B2 * 6/2016 Tamura ................. G01R 33/091
(Continued)

FOREIGN PATENT DOCUMENTS

CN       102998517 A     3/2013
EP        2515125 A2    10/2012
(Continued)

OTHER PUBLICATIONS

Extended European Search Report dated Feb. 16, 2018, for the European Application No. 15810125.3.

*Primary Examiner* — Reena Aurora
(74) *Attorney, Agent, or Firm* — Volpe and Koenig, P.C.

(57) ABSTRACT

The purpose of the present invention is to provide a current detection device which is less susceptible to a disturbance magnetic flux and does not easily cause the decrease of a detectable maximum current. A current detection device is provided with: a first magnetic shield member which has a side wall part that covers one side of a conductor and a protruding part that protrudes toward the other side from the side wall part; and a second magnetic shield member which has a side wall part that covers the other side of the conductor and a protruding part that protrudes toward the one side from the side wall part, and the protruding part of the first magnetic shield member and the protruding part of the second magnetic shield member form a gap therebetween while overlapping each other in the protruding direction of the protruding parts.

4 Claims, 13 Drawing Sheets

(58) Field of Classification Search
USPC .......................................................... 324/225
See application file for complete search history.

(56) References Cited

U.S. PATENT DOCUMENTS

| | | |
|---|---|---|
| 9,417,269 B2 * | 8/2016 | Sakai .................. G01R 15/205 |
| 2006/0082357 A1 | 4/2006 | Tsukamoto |
| 2009/0027047 A1 | 1/2009 | Kinzel |
| 2014/0184212 A1 | 7/2014 | Yamaguchi et al. |

FOREIGN PATENT DOCUMENTS

| | | |
|---|---|---|
| JP | 2011-149827 A | 8/2011 |
| JP | 2013-117447 A | 6/2013 |
| JP | 2013-195381 A | 9/2013 |
| JP | 2013-228315 A | 11/2013 |
| WO | 2013/031291 A1 | 3/2013 |
| WO | 2013/080557 A1 | 6/2013 |

\* cited by examiner

FIRST PHASE   SECOND PHASE   THIRD PHASE

CURRENT DETECTION DEVICE

TECHNICAL FIELD

The present invention relates to a current detection device which can measure a current flowing to a conductor in a non-contact manner, and particularly to a current detection device which is suitably used to detect a large current in a power conversion device such as an HEV (hybrid automobile) or an EV (electric automobile).

BACKGROUND ART

Conventionally, there is known a current detection device which uses a U-shaped magnetic shield in a core-less current detection device from which a magnetic core is excluded. There is a need to make a cross-sectional dimension of the magnetic shield small in order to miniaturize the current detection device. However, a saturated magnetic flux of the magnetic shield is lowered as the cross-sectional dimension of the magnetic shield becomes smaller. The magnetic shield has a magnetism collecting function similarly to the magnetic core. In a case where a hall element detects the magnetic flux, the reduction of the saturated magnetic flux of the magnetic shield results in reduction of a detectable maximum current. Therefore, it is difficult to achieve both the miniaturization of the current detection device and the measurement of a large current in the conventional magnetic shield at the same time. With this regard, there is disclosed a shield structure in JP 2013-195381 A (PTL 1).

In the current detection device of PTL 1, the magnetic shield is configured by a plurality of shield materials. The conductor has a rectangular cross-sectional surface which is short in the vertical direction and long in the horizontal direction. The magnetic shield has two short side walls (side walls) disposed on a side near two short sides of the conductor and one long side wall (bottom wall) disposed on aside near the long side of the conductor. The magnetic shield has a cross section reducing portion such as a gap, a notch, or a through hole in the long side wall, to increase the magnetic flux leaking out to the outside of the magnetic shield and to reduce the magnetic flux passing through the magnetic shield. With the configuration, the measurable maximum current is increased while suppressing the reduction of the saturated magnetic flux of the magnetic shield.

CITATION LIST

Patent Literature

PTL 1: JP 2013-195381 A

SUMMARY OF INVENTION

Technical Problem

However, in the configuration that a gap or a through hole (hereinafter, referred to as a shield opening) is provided in the long side wall, the disturbing magnetic flux from the outside enters the magnetic shield through the shield opening. Therefore, there is a concern that a current sensor is degraded in reliability. In addition, in the magnetic shield provided with the cross section reducing portion, the magnetic flux is collected in the magnetic shield where the cross-sectional area is changed, and thus the magnetic flux density is increased in some portion. Therefore, there is a problem in that the saturated magnetic flux in the magnetic shield is lowered, and a measurable maximum current is lowered.

An object of the invention is to provide a current detection device which is hardly affected by a disturbing magnetic flux and hardly causes a reduction of the measurable maximum current.

Solution to Problem

In order to achieve the above object, a current detection device of the invention includes a first magnetic shield member which includes a side wall covering one side of a conductor and a protrusion portion protruding from the side wall toward the other side, and a second magnetic shield member which includes a side wall covering the other side of a conductor and a protrusion portion protruding from the side wall toward the one side. The protrusion portion of the first magnetic shield member and the protrusion portion of the second magnetic shield member form a gap while being overlapped with each other in a protruding direction of the protrusion portion.

Advantageous Effects of Invention

A bottom of the first magnetic shield member and a bottom of the second magnetic shield member are overlapped with each other in their extending direction so as to form a gap. Therefore, it is possible to suppress the intrusion of the disturbing magnetic flux from the bottom of the magnetic shield. Further, it is possible to prevent the reliability of a current detection device from being lowered due to the disturbing magnetic flux. In addition, with the gap provided, the magnetic flux leaks out to the outside of the magnetic shield, so that the measurable maximum current can be increased.

The other objects, configurations, and advantages will be apparent by the description of the following embodiments.

DESCRIPTION OF EMBODIMENTS

Figure 1:
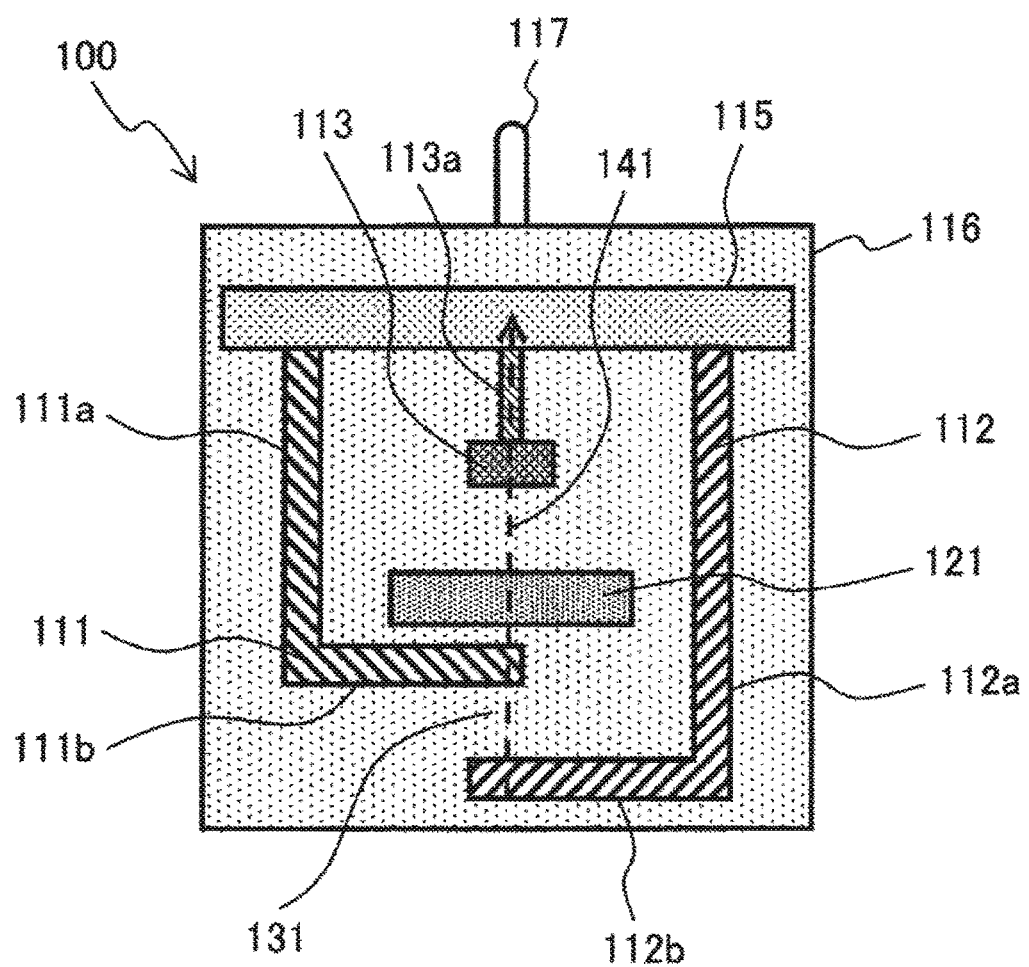
FIG. 1 is a diagram illustrating a configuration of a current detection device according to the invention.

Hereinafter, embodiments of the invention will be described using the drawings. Further, the portions having the same configuration in the drawings will be assigned with the same symbol, and the description thereof will be omitted.

Figure 2:
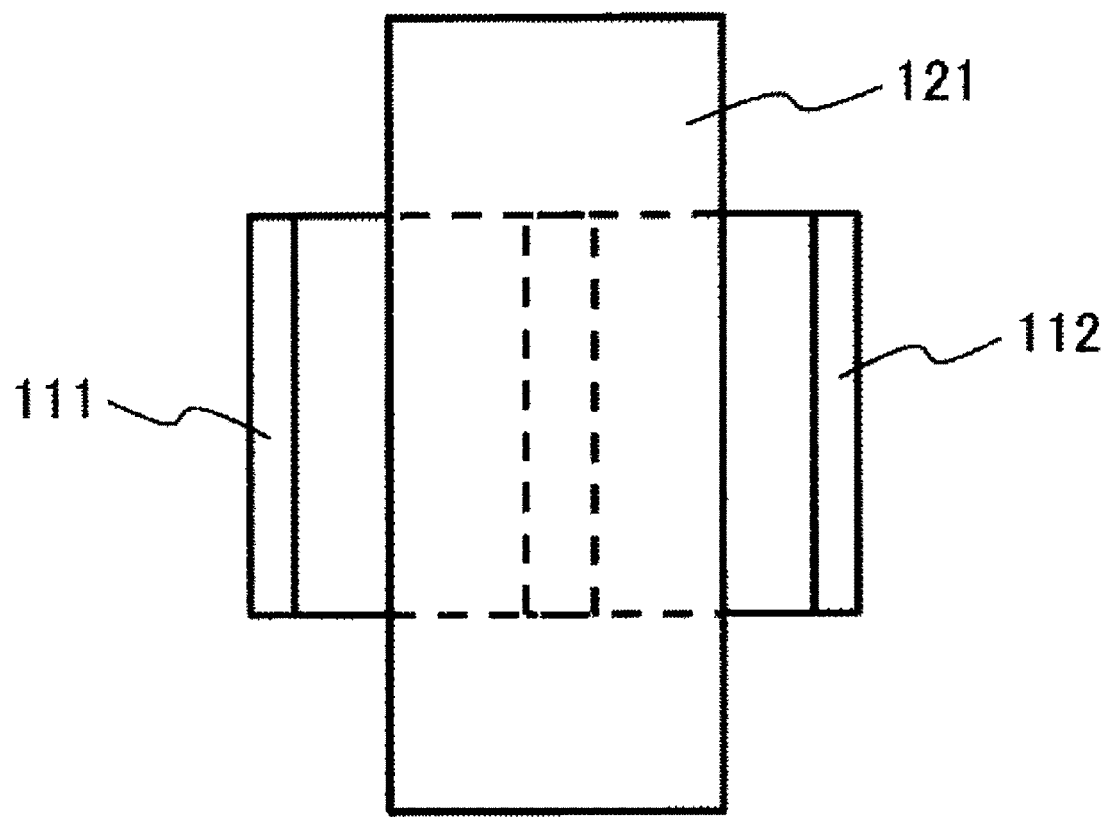
FIG. 2 is a top view of the current detection device according to the invention.
Figure 3:
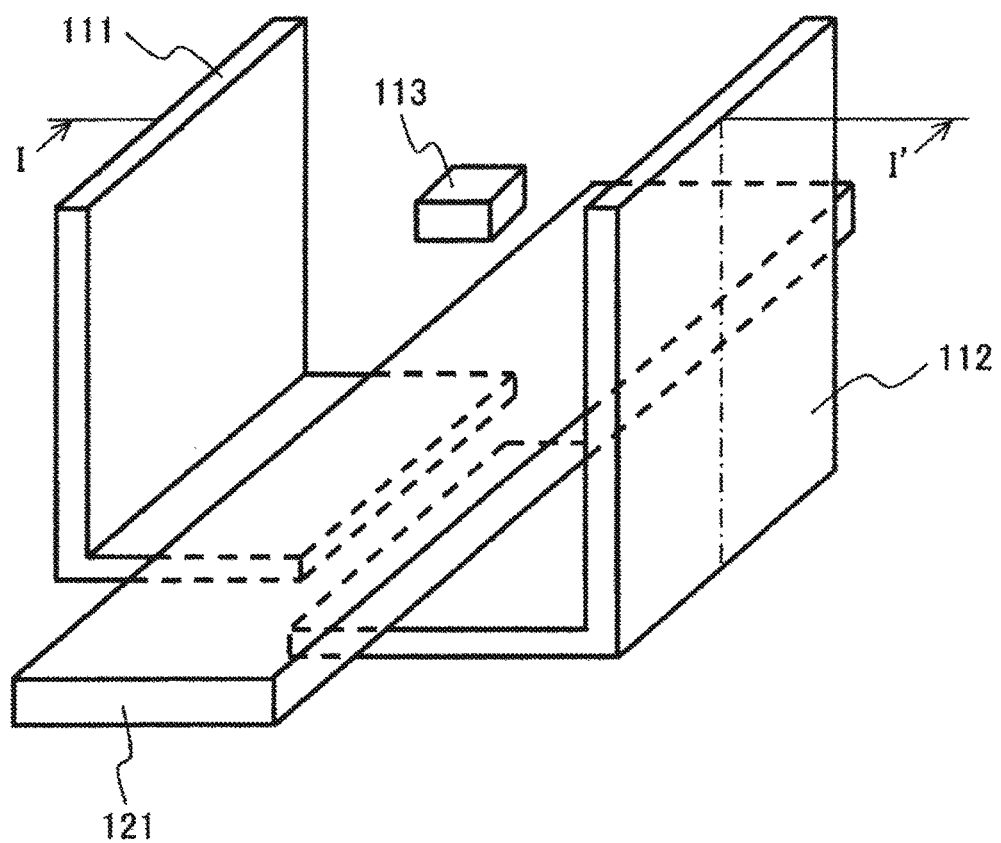
FIG. 3 is a perspective view of the current detection device according to the invention.

A configuration of a current detection device according to this embodiment will be described using FIGS. 1 to 3. FIG. 1 is a diagram illustrating a configuration of the current detection device according to this embodiment. FIG. 2 is a top view of the current detection device according to this embodiment. FIG. 3 is a perspective view of the current detection device according to this embodiment. Further, FIG. 1 corresponds to a cross section taken along a line I-I' of FIG. 3. In the following description, a vertical direction will be defined on the basis of FIG. 1, and has no relation with the vertical direction in a mounted state of the current detection device.

Figure 7:
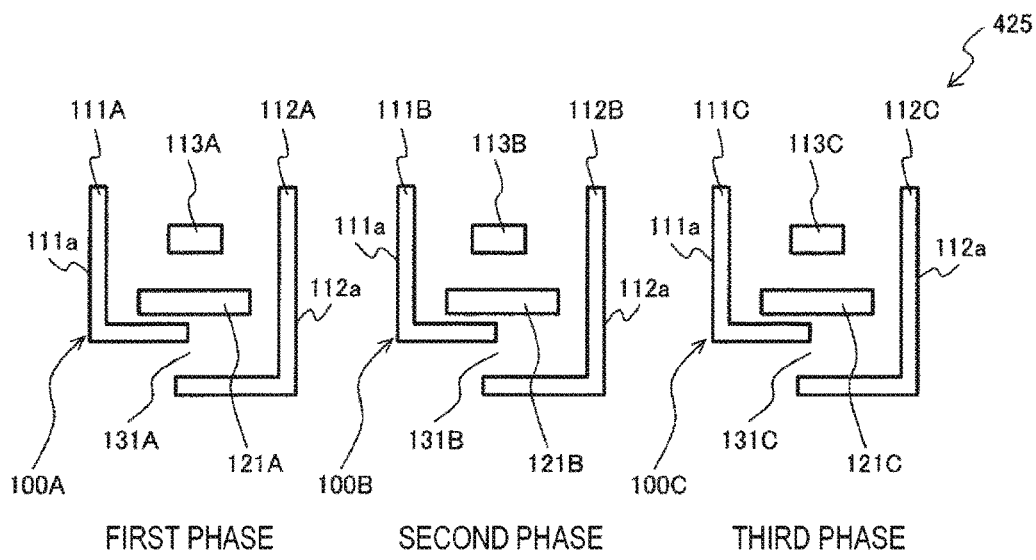
FIG. 7 is a schematic view illustrating a three-phase current detection device which is configured by the current detection device according to the invention.

A current detection device 100 includes an L-shaped first magnetic shield member (magnetic material) 111, a second magnetic shield portion 112, a hall element 113 which is provided as a current sensor, and a conductor 121. The first magnetic shield member 111, the second magnetic shield portion 112, and the hall element 113 are fixed to a printed circuit board (substrate member) 115. The printed circuit board 115 is configured by an insulating material and has nonmagnetism. In addition, the first magnetic shield member 111, the second magnetic shield portion 112, the conductor 121, and the hall element 113 are coated with a resin 116 together with the printed circuit board 115. In this embodiment, the hall element 113 is configured to be buried with the resin 116, and may be configured without substrate as illustrated in FIG. 7 described below such that the hall element 113 is disposed on the outside of the resin 116.

The hall element 113 is fixed to the printed circuit board 115 by fixing a plurality of terminals 113a to the printed circuit board 115. In addition, the plurality of terminals 113a is electrically connected to a terminal 117 which is exposed from the resin. The plurality of terminals 113a of the hall element 113 may be exposed from the resin 116 to be used in substitution of the terminal 117.

The conductor (current detection target) 121 has a rectangular surface of which the cross section is short in the vertical direction and long in the horizontal direction, and disposed to pass through the space inside the magnetic shields 111 and 112 which are configured by the first magnetic shield member 111 and the second magnetic shield member 112. The current flows along a longitudinal direction (extending direction) of the conductor 121.

The first magnetic shield member 111 and the second magnetic shield member 112 are disposed to face each other while interposing the conductor 121. The first magnetic shield member 111 and the second magnetic shield member 112 are made of a magnetic material. The first magnetic shield member 111 and the second magnetic shield member 112 each have an L shape. The first magnetic shield member 111 includes a side wall 111a which covers a side of the conductor 121, and a bottom 111b which faces toward the second magnetic shield member 112 from the lower end of the side wall 111a and is extended in a direction traversing the side wall 111a. The second magnetic shield member 112 includes a side wall 112a which covers a side of the conductor 121, and a bottom 112b which faces toward the first magnetic shield member 111 from the lower end of the side wall 112a and is extended in a direction traversing the side wall 112a.

The bottom 111b of the first magnetic shield member 111 and the bottom 112b of the second magnetic shield member 112 are offset in the vertical direction to form a gap 131 in the vertical direction on the lower side of the conductor 121. In addition, the bottom 111b of the first magnetic shield member 111 and the bottom 112b of the second magnetic shield member 112 are disposed to be overlapped in the extending direction.

Further, a straight line 141 is a line segment perpendicular to the substrate surface (the mounting surface of the first magnetic shield member 111, the second magnetic shield member 112, and the hall element 113) of the printed circuit board 115, and is located at an equal distance from the side wall 111a and the side wall 112a. In addition, FIG. 1 is a cross-sectional view. In a case where a depth direction of FIG. 1 is taken into consideration, the straight line 141 may be considered as a plane spreading in the depth direction of FIG. 1. The side wall 111a and the side wall 112a have a plane (hereinafter, referred to as a side wall) in parallel to their planes.

In this embodiment, the first magnetic shield member 111 is disposed on one side of the conductor 121, and the second magnetic shield member 112 is disposed on the other side of the conductor 121. The side wall 111a of the first magnetic shield member 111 and the side wall 112a of the second magnetic shield member 112 face each other while interposing the conductor 121. The bottom 111b of the first magnetic shield member 111 and the bottom 112b of the second magnetic shield member 112 cover the lower side of the conductor 121.

The first magnetic shield member 111 and the second magnetic shield member 112 collect a magnetic flux generated in the vicinity of the conductor 121 according to a right-handed screw rule, and form the lines of magnetic flux in the first magnetic shield member 111 and the second magnetic shield member 112. The lines of magnetic flux leak out from one of the first magnetic shield member 111 and the second magnetic shield member 112 in a portion of the gap 131, and move to the other magnetic shield member.

The hall element (current sensor) 113 is disposed on the straight line 141 connecting the conductor 121 and the gap 131, and fixed to the printed circuit board 115. A majority of the lines of magnetic flux extending between the first magnetic shield 111 and the second magnetic shield member 112 near the printed circuit board 115 is substantially extended along the printed circuit board 115. Therefore, a majority of the extending magnetic flux passes through the hall element 113. As a result, the hall element 113 can detect a minute magnetic flux generated by the current flowing in the conductor 121 by a magnetism collecting function of the magnetic shields 111 and 112. Therefore, a magnetic detection sensitivity is increased. The hall element 113 outputs a voltage in proportion to a magnetic flux density caused when a predetermined current is applied.

In this embodiment, the configuration has been described using the printed circuit board 115, but a substrate-less configuration having no printed circuit board 115 may be employed. In the substrate-less configuration, the first magnetic shield 111, the second magnetic shield member 112, the conductor 121, and the hall element 113 are fixed by the resin mold 116. The respective structures may be easily fixed to predetermined positions using the resin mold 116.

The magnetic flux density of the lines of magnetic flux extending between the first magnetic shield 111 and the second magnetic shield member 112 is almost in linear proportion to a current value of the conductor 121 when the magnetic flux density inside the magnetic shields 111 and 112 is equal to or less than a saturated magnetic flux density of the magnetic shield. On the other hand, when the current value of the conductor 121 is increased and the magnetic flux density inside the magnetic shields 111 and 112 reaches the saturated magnetic flux density of the magnetic shield, the linearly proportional relation between the magnetic flux density of the lines of magnetic flux (extending between the first magnetic shield 111 and the second magnetic shield member 112) and the current value of the conductor 121 is lost. For this reason, it is not possible to accurately measure the current value of the conductor 121 using the hall element 113. Therefore, the current value of the conductor 121 which is measurable using the hall element 113 is determined by the magnitude of the saturated magnetic flux density in the magnetic shields 111 and 112. According to this embodiment, the gap 131 is formed in the bottom (the bottom 111*b* and the bottom 112*b*) which is configured by the first magnetic shield member 111 and the second magnetic shield member 112. The gap 131 divides the magnetic path formed in the bottom of the magnetic shield, and appropriately lowers the magnetic flux density in the magnetic shield. In addition, the gap 131 has a function of lowering even the magnetic flux density of the lines of magnetic flux extending between the magnetic shields.

Since there is no other magnetic shield serving as a magnetic path above the magnetic shields 111 and 112 in the current detection device 100 in this embodiment, the lines of magnetic flux in the current detection device 100 are extended almost in the vertical direction with respect to the shield side surface between the magnetic shields 111 and 112, and pass through the hall element 113. As a result, the hall element 113 senses the magnetic flux almost in proportion to the current of the conductor 121, and outputs a voltage in proportion to the magnetic flux.

In the current detection device of this embodiment, the conductor 121 is positioned in the vicinity of the bottom of the first magnetic shield member 111, and passes through the inner space configured by the first magnetic shield member 111 and the second magnetic shield member 112. In FIG. 1, there is a gap between the first magnetic shield member 111 and the conductor 121. The gap is small or ignorable if there is no problem in the magnetic saturation in the magnetic shields 111 and 112. In other words, an insulator may be disposed between the first magnetic shield member 111 and the conductor 121, and the first magnetic shield member 111 may be fixed to the bottom of the conductor 121 through the insulator.

Figure 4:
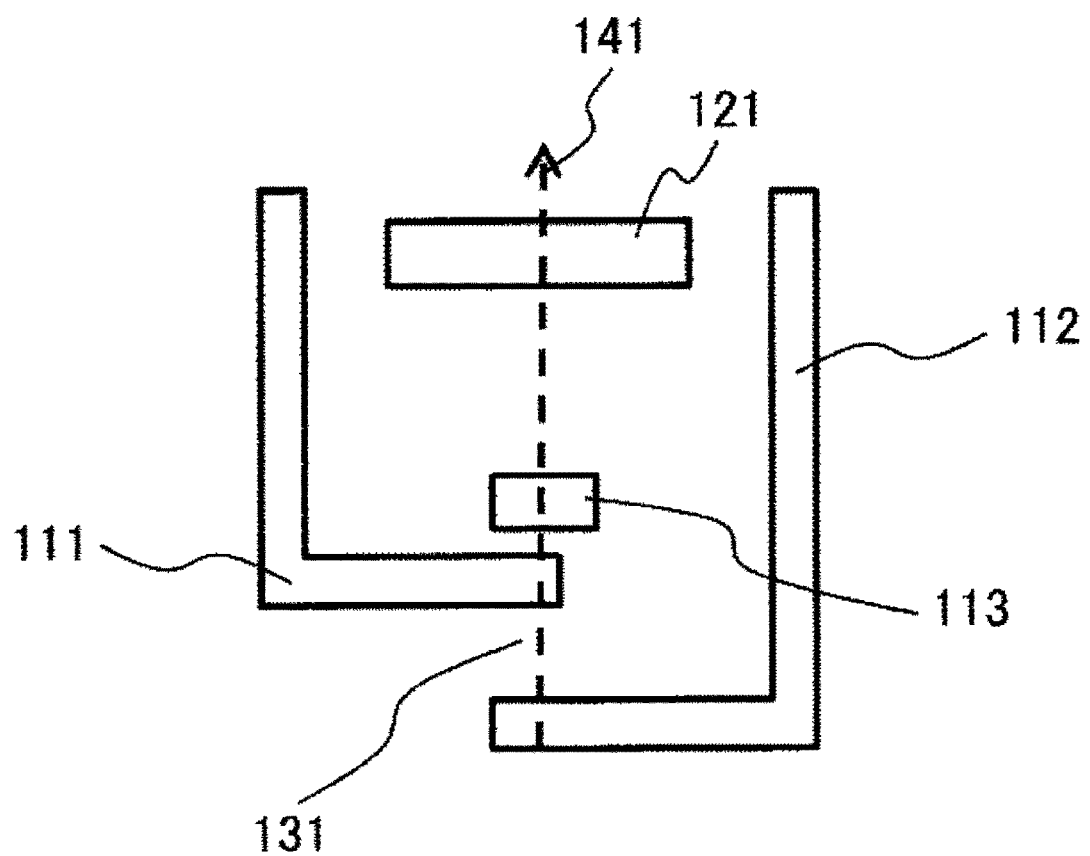
FIG. 4 is a diagram illustrating an exemplary configuration in which a hall element is changed in position.

Next, the description will be made about an example in which the hall element 113 is changed in position using FIG. 4. FIG. 4 is a diagram illustrating an exemplary configuration where the hall element 113 is changed in position. Further, the printed circuit board 115 and the resin 116 depicted in FIG. 1 are omitted in FIG. 4, but the printed circuit board 115 and the resin 116 are configured in the same way as that of FIG. 1.

In this modification, the hall element 113 is disposed in the space between the conductor 121 and the bottoms (the bottoms 111*b* and 112*b*) of the magnetic shields 111 and 112 configured by the first magnetic shield member 111 and the second magnetic shield member 112. The hall element may be configured as described above.

Figure 5:
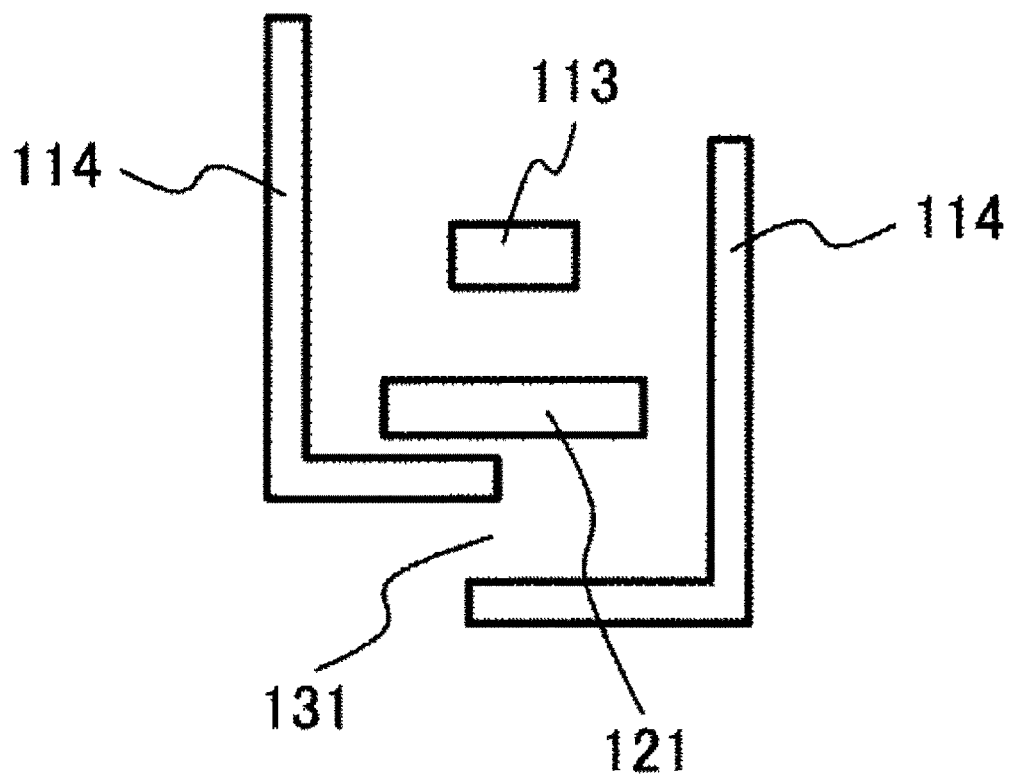
FIG. 5 is a diagram illustrating a configuration of a modification in which a first magnetic shield member and a second magnetic shield member are made in the same shape.

Next, the description will be made using FIG. 5 about a modification in which the first magnetic shield member 111 and the second magnetic shield member 112 are made in the same shape. FIG. 5 is a diagram illustrating a configuration of the modification in which the first magnetic shield member 111 and the second magnetic shield member 112 are made in the same shape.

In the modification, the length of the side wall 111*a* of the first magnetic shield member 111 and the length of the side wall 112*a* of the second magnetic shield member 112 are equal. Then, the upper end surface of the side wall 111*a* of the first magnetic shield member 111 and the upper end surface of the side wall 112*a* of the second magnetic shield member 111 are fixed in a deviated manner. Such a configuration can be easily realized using a structure in which the first magnetic shield member 111 and the second magnetic shield member 112 are fixed by the resin mold 116 without using the printed circuit board 115. The printed circuit board 115 may be used by providing a step portion in an installation area of the printed circuit board 115.

According to the modification, the first magnetic shield member 111 and the second magnetic shield member 112 can be configured using the same material, so that productivity is improved.

Figure 6:
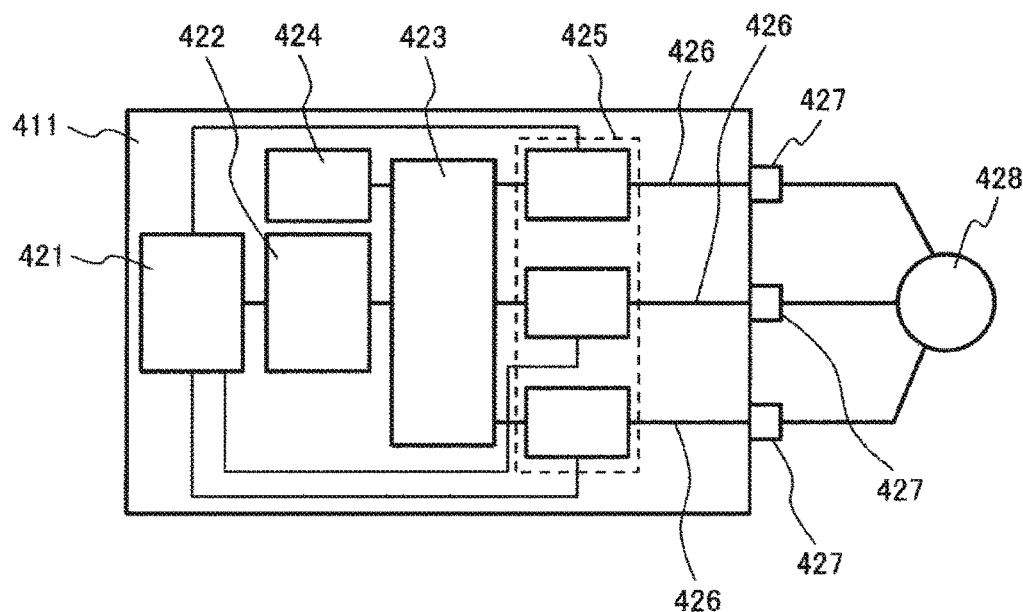
FIG. 6 is a diagram illustrating a configuration in which the current detection device according to the invention is mounted in a power conversion device.

Next, the description will be made about an example of mounting the current detection device 100 using FIGS. 6 and 7. FIG. 6 is a diagram illustrating a configuration in which the current detection device 100 according to this embodiment is mounted in a power conversion device 411. FIG. 7 is a diagram schematically illustrating a three-phase current detection device which is configured by the current detection device 100 according to this embodiment. In the current detection device illustrated in FIG. 7, the portions having the same structure as those of the current detection device of FIG. 1 will be attached with the same symbols. The description on the portions having the same structure will be omitted, and only differences will be described. Further, the description in the following will be made about a first-phase current detection device and a second-phase current detection device. An interaction between the adjacent current detection devices is similar not only between the first-phase device and the second-phase device but also between the second-phase device and the third-phase device and between the third-phase device and the first-phase device.

The power conversion device 411 is configured by a micro-controller 421, a drive circuit 422, a power module 423, a capacitor 424, a current detection device 425, a conductor 426 (121), and a terminal 427. The power conversion device 411 is used to activate a motor 428.

The current detection device 425 is disposed on the conductor 426 which contains a busbar between the power module 423 and the terminal 427. The current detection device 425 measures a current value output from the power module 423, and feeds the detected current value back to the micro-controller 421. As illustrated in FIG. 7, the similar current detection devices 100A, 100B, and 100C are disposed in the three-phase current detection device 425 in the horizontal direction. Specifically, the three-phase current detection device 425 is configured by arranging three current detection devices 100 (100A, 100B, and 100C) illustrated in FIG. 1. In the current detection devices 100A, 100B, and 100C, first magnetic shield members 111A, 111B, and 111C, second magnetic shield members 112A, 112B, and 112C, conductors 121A, 121B, and 121C, and hall elements 113A, 113B, and 113C are provided respectively.

In the current detection device 100 illustrated in FIG. 1, the length of the side wall 111a and the length of the side wall 111b are different. Therefore, in the three-phase current detection device 425 using the arranged current detection devices 100, the length (length of the side wall) of the first magnetic shield 111B of the second-phase current detection device adjacent to the first-phase current detection device is different from the length (length of the side wall) of the second magnetic shield 112A of the first-phase current detection device adjacent to the second-phase current detection device.

Therefore, the long side wall 112a of the first-phase current detection device 100A and the short side wall 111a of the second-phase current detection device 100B are adjacently disposed between the first-phase current detection device 100A and the second-phase current detection device 100B. In addition, the long side wall 112a of the second-phase current detection device 100B and the short side wall 111a of the third-phase current detection device 100C are adjacently disposed between the second-phase current detection device 100B and the third-phase current detection device 100C.

In this way, an influence of disturbance between the adjacent current detection devices can be made equal between the respective phases by disposing the current detection devices such that the long side wall 112a and the short side wall 111a are in relation to be the same between the respective phases. With this configuration, it is possible to make the sensitivity of the current detection device even with respect to the magnetic flux generated from the magnetic flux generated from the conductor 426 (121), which is advantageous in view of control.

Of course, in a case where the current detection devices 100 are disposed away from each other at a distance having no influence of disturbance toward the other phases, the current detection devices 100 may be disposed without considering the order of arranging the long side wall 112a and the short side wall 111a.

Further, the above-described various types of modifications may be employed as the current detection device 100 of the three-phase current detection device in place of the configuration illustrated in FIG. 1.

Figure 8:
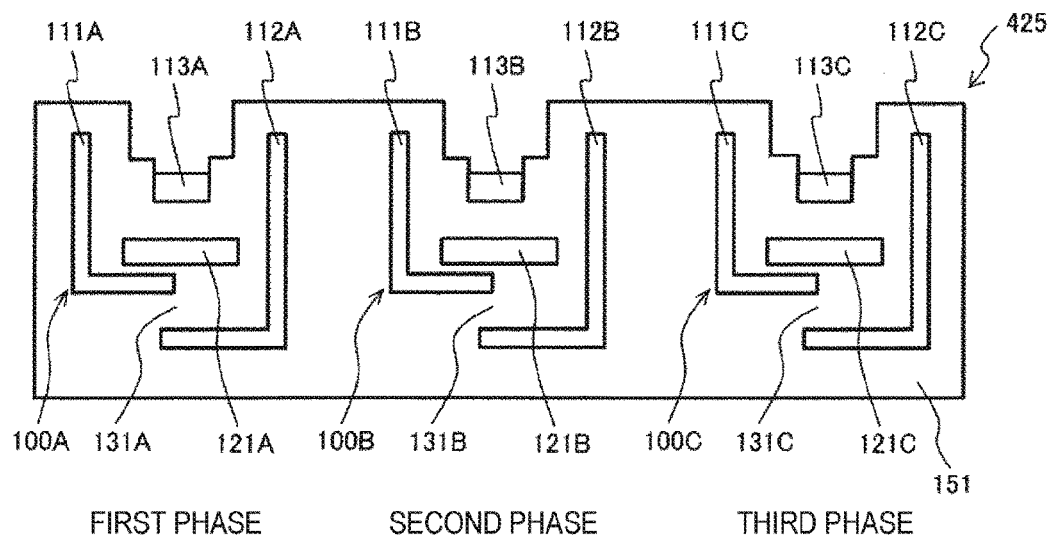
FIG. 8 is a front view of the three-phase current detection device according to the invention.

Next, the description will be made about a specific exemplary configuration of the three-phase current detection device 425 using FIG. 8. FIG. 8 is a front view of the three-phase current detection device 425 according to this exemplary configuration.

In the respective current detection devices 100A, 100B, and 100C, the first magnetic shield members 111A, 111B, and 111C, the second magnetic shield members 112A, 112B, and 112C, and the conductor 121 are fixed by the resin mold 116 in advance. The hall elements 113A, 113B, and 113C are easily assembled by being disposed on the side of the resin mold 116. The hall elements 113A, 113B, and 113C are attached later to an assembly made of the first magnetic shield members 111A, 111B, and 111C, the second magnetic shield members 112A, 112B, and 112C, the conductor 121, and the resin mold 116. Thus, in a case where a defect or a damage of the hall element occurs after adjustment, only the hall elements 113A, 113B, and 113C can be replaced without discarding the current detection devices 100A, 100B, and 100C containing the conductor 426. Therefore, it is possible to reduce a manufacturing cost, which is advantageous.

Of course, all the components of the three-phase current detection device 426 including the hall elements 113A, 113B, and 113C may be integrated by the resin mold 116.

Further, applying the configuration of FIG. 8 to the current detection device 100 of FIG. 1 or 5, the first magnetic shield member 111, the second magnetic shield member 112, and the conductor 121 may be fixed by the resin mold 116, and the hall element 113 may be disposed outside the resin mold 116.

Figure 9:
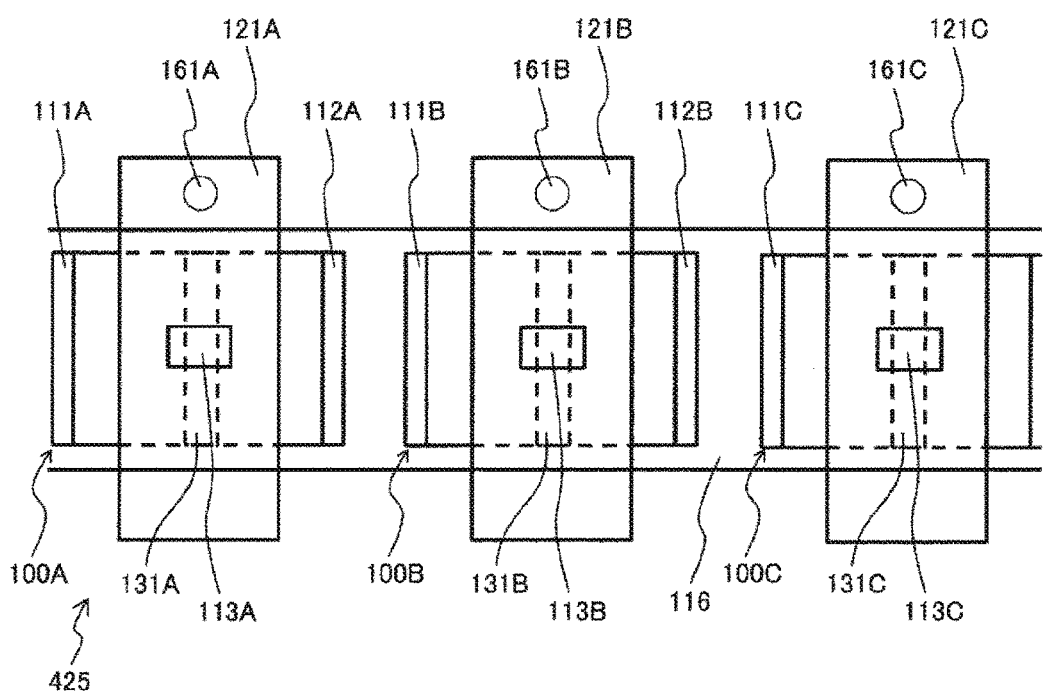
FIG. 9 is a top view illustrating an example in which the three-phase current detection device according to the invention is applied to a power conversion device used for an HEV or an EV.

Next, the description will be made using FIG. 9 about an example in which the three-phase current detection device according to the invention is applied to an on-vehicle power conversion device used in an HEV (hybrid automobile) or an EV (electric automobile). FIG. 9 is a top view illustrating an example in which the three-phase current detection device according to the invention is applied to a power conversion device used in an HEV or an EV.

The three-phase current detection device 425 is used to individually measure currents of U, V, and W phases of the power conversion device used in the HEV or the EV for example. The current detection device 100A is provided in the U phase. The current detection device 100B is provided in the V phase. The current detection device 100C is provided in the W phase. In each conductor 121, the current flows toward the longitudinal direction of the conductor 121. In the conductors 121A, 121B, and 121C, bolt holes 161A, 161B, and 161C are provided at the ends in the longitudinal direction for mounting, and fixed to the output terminals 427 (see FIG. 6) using an attaching bolt. The ends on the other sides in the longitudinal direction are bonded by welding to the output terminals of the power module 423 (see FIG. 6), and input portions (cables) of the currents of the respective phases are connected to the conductors 121, 121B, and 121C.

The conductors 121A, 121B, and 121C may be configured by the output terminals of the power module 423. In this case, the conductors 121A, 121B, and 121C are not necessarily bonded by welding. In addition, the power module 423 and the three-phase current detection device 425 are integrally configured. Alternatively, the three-phase current detection device 425 configured separately can be assembled to the conductors 121A, 121B, and 121C configured by the output terminals of the power module 423 by exposing the conductors 121A, 121B, and 121C and part of the first magnetic shield member 111 and the second magnetic shield member 112 from the resin mold 116. In this case, the three-phase current detection device 425 is configured without the conductors 121A, 121B, and 121C. The configuration that the conductor 121 is separately provided can be applied even to the configuration described using FIGS. 1 to 8.

The single gap 131 (131A, 131B, and 131C) is formed on the straight line 141 (see FIG. 1) passing through substantially the center of the cross section of the conductor 121 (121A, 121B, and 121C). Therefore, the magnetic flux leaked out of the gap 131 comes to leak out toward the lower side of the current detection device 100 (100A, 100B, and 100C), so that it is possible to suppress that the magnetic flux comes into the adjacent current detection device.

Hereinafter, the description will be made about the current detection device 100, which is the same as that in the current detection devices 100A, 100B, and 100C of the three-phase current detection device 425.

By forming the single gap 131, the lines of magnetic flux generated between the first magnetic shield member 111 and the second magnetic shield member 112 are extended along the substrate between the magnetic shields 111 and 112 except the surroundings of the magnetic shields 111 and 112. Therefore, the magnetic flux density of the lines of magnetic flux except the surroundings of the magnetic shields 111 and 112 shows a small amount of change in the vertical direction with respect to the side surface of the magnetic shield. In the above configuration, the hall element 113 is disposed substantially on the straight line 141 connecting the gap 131 and the conductor 121. However, for the above reason, the hall element 113 is not necessarily disposed on the straight line (the center of the conductor 121) 141, and may be disposed to be shifted from the straight line 141. This embodiment is not limited in disposing the hall element 113.

Figure 10:
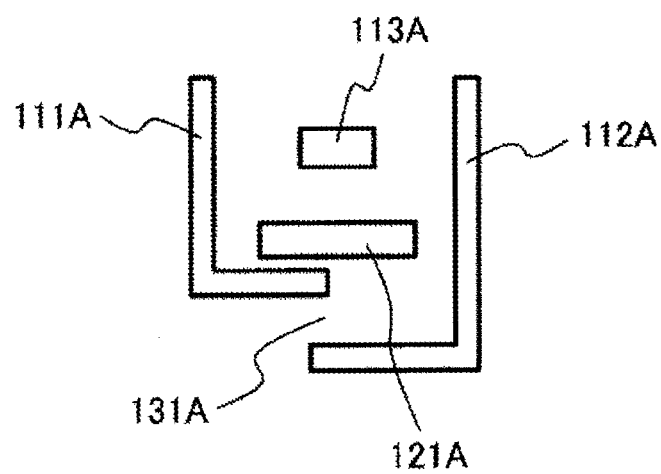
FIG. 10 is a diagram illustrating a configuration in which three current detection devices are vertically disposed.
Figure 10:
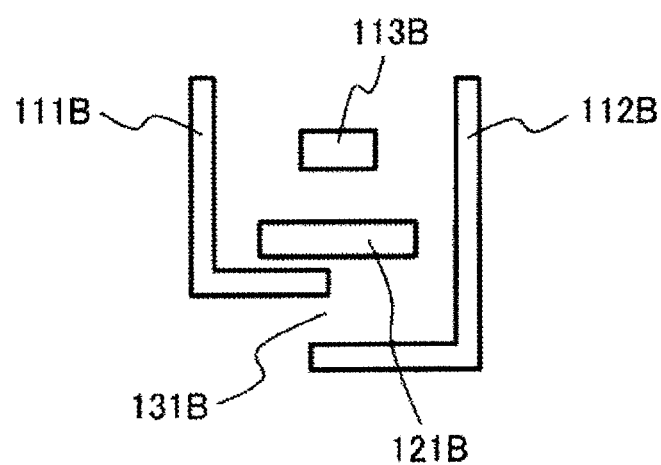
Figure 10:
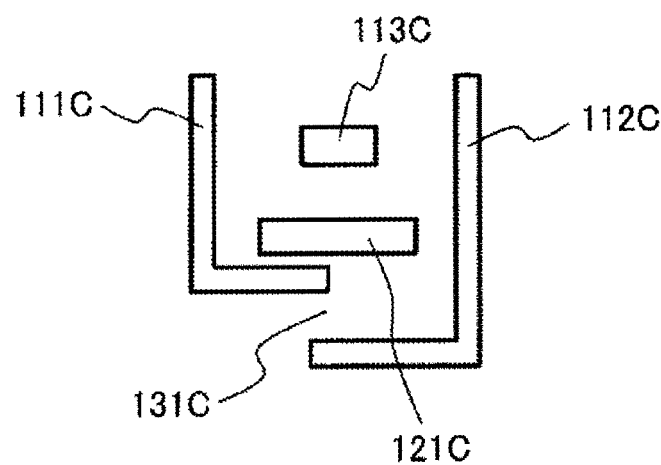

FIG. 10 is a diagram illustrating a configuration in which the current detection devices 100A, 100B, and 100C are vertically disposed. In FIGS. 7, 8, and 9, the current detection devices 100A, 100B, and 100C are adjacently (horizontally) disposed to make the side walls of the respective magnetic shield members face each other. With this regard, as illustrated in FIG. 10, the current detection devices may be disposed (vertically) such that the bottoms of the respective magnetic shield members face toward the same direction.

Figure 11:
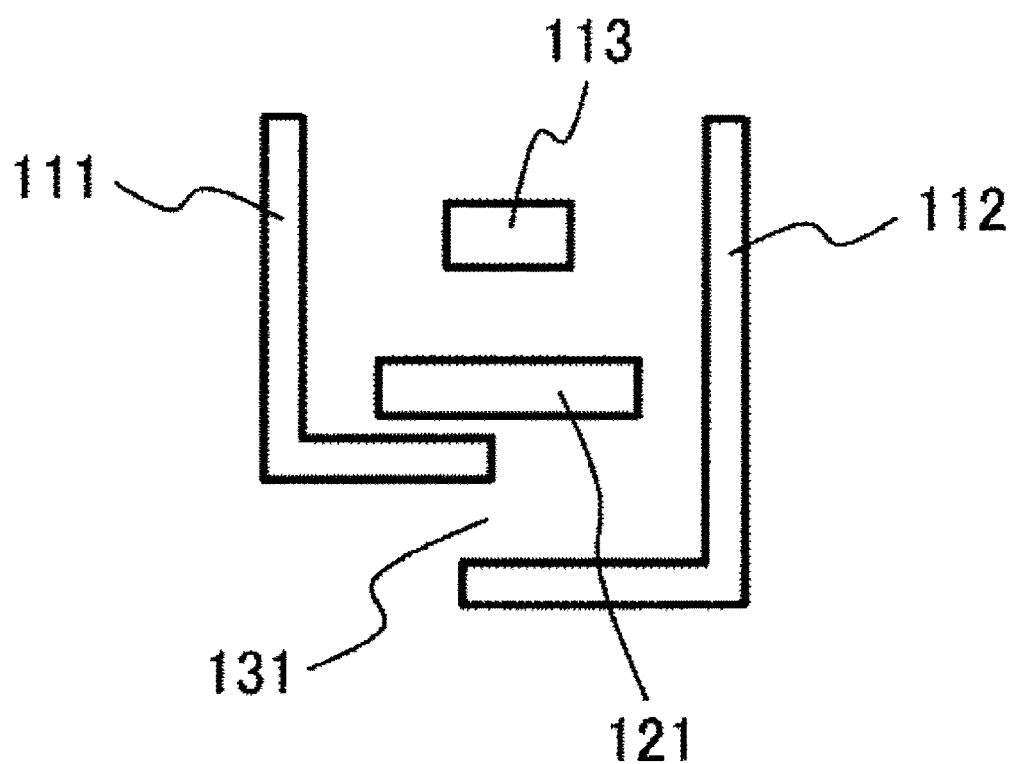
FIG. 11 is a diagram illustrating a state in which a conductor causing disturbance is disposed at a position facing a bottom of the current detection device.
Figure 11:

The description will be made using FIG. 11 about a case where a conductor 171 causing disturbance is disposed. FIG. 11 is a diagram illustrating a state in which the conductor 171 is disposed at a position facing the bottom of the current detection device 100. The current detection device 100 is configured such that the first magnetic shield member 111 and the second magnetic shield member 112 are overlapped with the bottom of the current detection device 100. With this configuration, even when the conductor 171 causing disturbance is disposed in the space on the lower side of the current detection device 100, it is possible to suppress that the disturbance directly intrudes into the magnetic shields 111 and 112 from the bottom of the magnetic shields 111 and 112.

Figure 12:
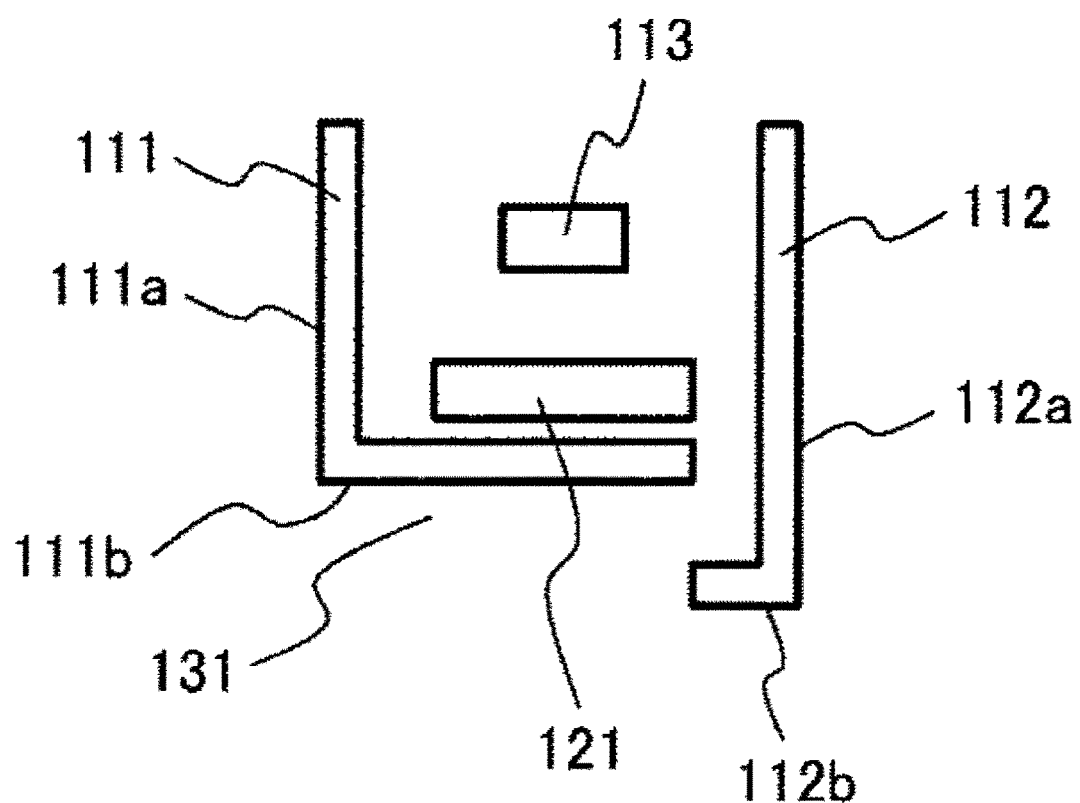
FIG. 12 is a diagram illustrating a modification in which the configuration of a gap between the first magnetic shield member and the second magnetic shield member is changed.

The description will be made using FIG. 12 about a modification in which the configuration of the gap 131 is changed. FIG. 12 is a diagram illustrating the modification in which the configuration of the gap 131 is changed.

In the above-described embodiment, a protruding length of the bottom 111b and a protruding length of the bottom 112b are equal. In other words, as illustrated in FIG. 1 for example, the gap 131 is substantially positioned on the straight line 141. However, as illustrated in FIG. 12, the protruding length of the bottom 111b and the protruding length of the bottom 112b may be different. In this case, the gap 131 is provided to be deviated from the straight line 141 (the center of the cross section of the conductor 121). Further, in a case where the protruding length of the bottom 111b and the protruding length of the bottom 112b are different, the protruding length of the bottom 111b disposed on the inside (on a side near the conductor 121 or the hall element 113) is desirably made longer than that of the bottom 112b disposed on the outside. With this configuration, it is possible to realize a configuration that the conductor 121 or the hall element 113 is hardly seen from the gap 131.

Figure 13:
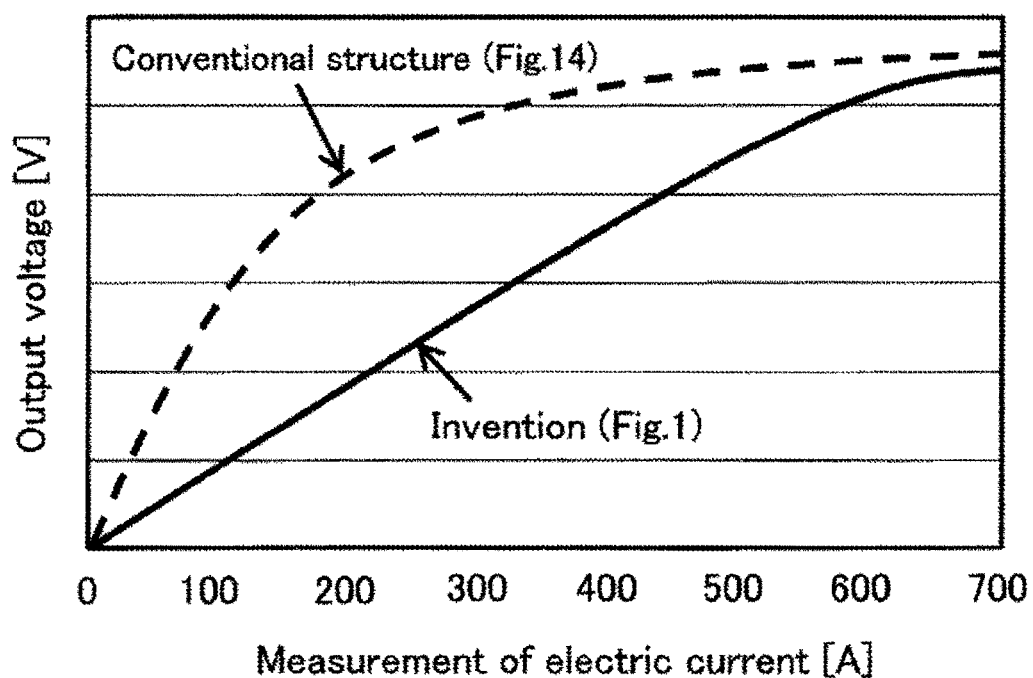
FIG. 13 is a diagram illustrating characteristics (analysis results) of an output voltage with respect to a current value in a case where the current detection device according to the invention is used and a case where the current detection device of a U-shaped magnetic shield is used.
Figure 14:
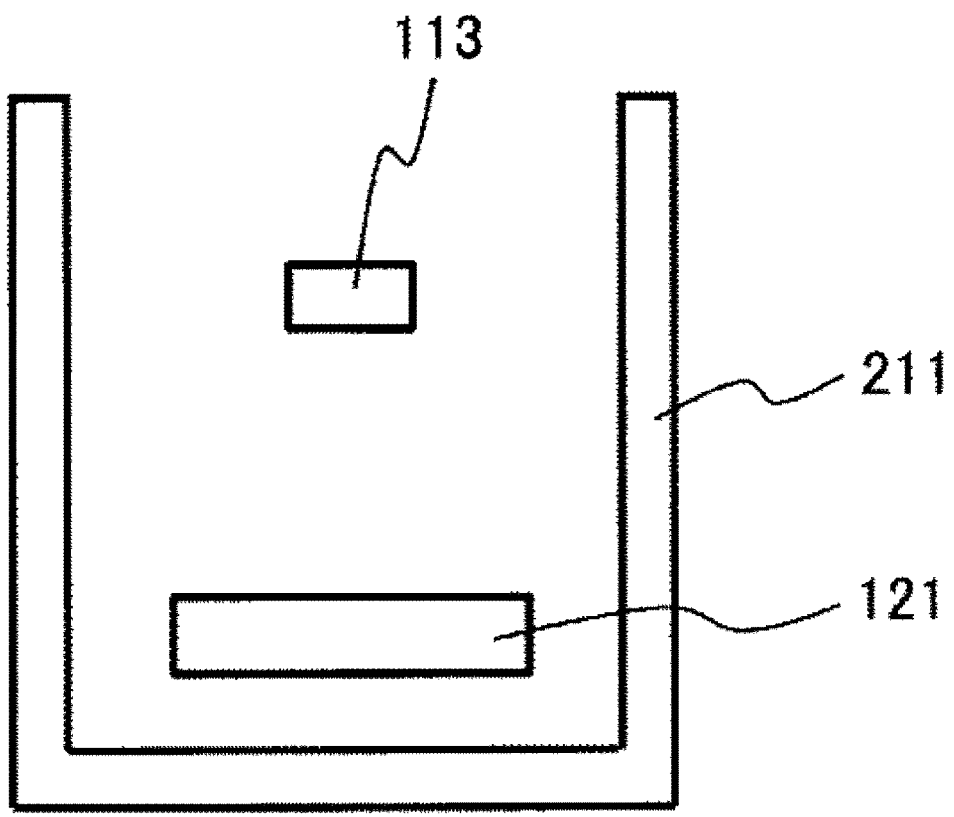
FIG. 14 is a diagram illustrating a configuration of the current detection device which is configured by a U-shaped shield.

Next, the description will be made using FIG. 13 about effects of increasing a measurable current value in a case where a current measurement device according to this embodiment is used. FIG. 13 is a diagram illustrating characteristics (analysis results) of the output voltage with respect to the current value in a case where the current detection device 100 according to this embodiment (FIG. 1) is used and a case where the current detection device illustrated in FIG. 14 is used. Further, FIG. 14 is a diagram illustrating a configuration of the current detection device which is configured by a U-shaped shield.

With the gap 131 in the configuration according to this embodiment, the magnetic flux leaks out to the outside of the first magnetic shield member 111 and the second magnetic shield member 112 through the gap 131, so that the magnetic flux density of the lines of magnetic flux in the space surrounded by the first magnetic shield member 111 and the second magnetic shield member 112 is lowered. As a result, a sensor output corresponding to the current value of the conductor 121 becomes small, and the measurable current value is increased.

In the above-described embodiment and modification, the conductors 121, 121A, 121B, and 121C are formed in a rectangular shape of which the cross section (a cross section perpendicular to the longitudinal direction) has long and short sides. The side wall 111a of the first magnetic shield member 111 and the side wall 112a of the second magnetic shield member 112 form short side walls disposed on a side near the short sides of the conductors 121, 121A, 121B, and 121C. The bottom 111b of the first magnetic shield member 111 and the bottom 112b of the second magnetic shield member 112 form long side walls disposed on a side near the long sides of the conductors 121, 121A, 121B, and 121C.

In addition, the side wall 111a of the first magnetic shield member 111 and the side wall 112a of the second magnetic shield member 112 are disposed on both sides (both sides) of the conductors 121, 121A, 121B, and 121C, and form both-side walls or facing-side walls which face each other while interposing the conductors 121, 121A, 121B, and 121C. The bottom 111b of the first magnetic shield member 111 and the bottom 112b of the second magnetic shield member 112 form one-side walls disposed on a side (one side) of the conductors 121, 121A, 121B, and 121C.

Further, each of the one-side walls 111b and 112b configures a protrusion portion which vertically protrudes or a bent portion which is vertically bent from the both-side walls 111a and 112a on one side toward the both-side walls 112a and 111a on the other side. The both-side walls 112a and 111a and the one-side walls 111b and 112b each are formed in a plate shape. Then, the both-side wall 112a and the both-side wall 111a are disposed in parallel. In addition, the one-side wall 111b and the one-side wall 112b are disposed in parallel.

Figure 15:
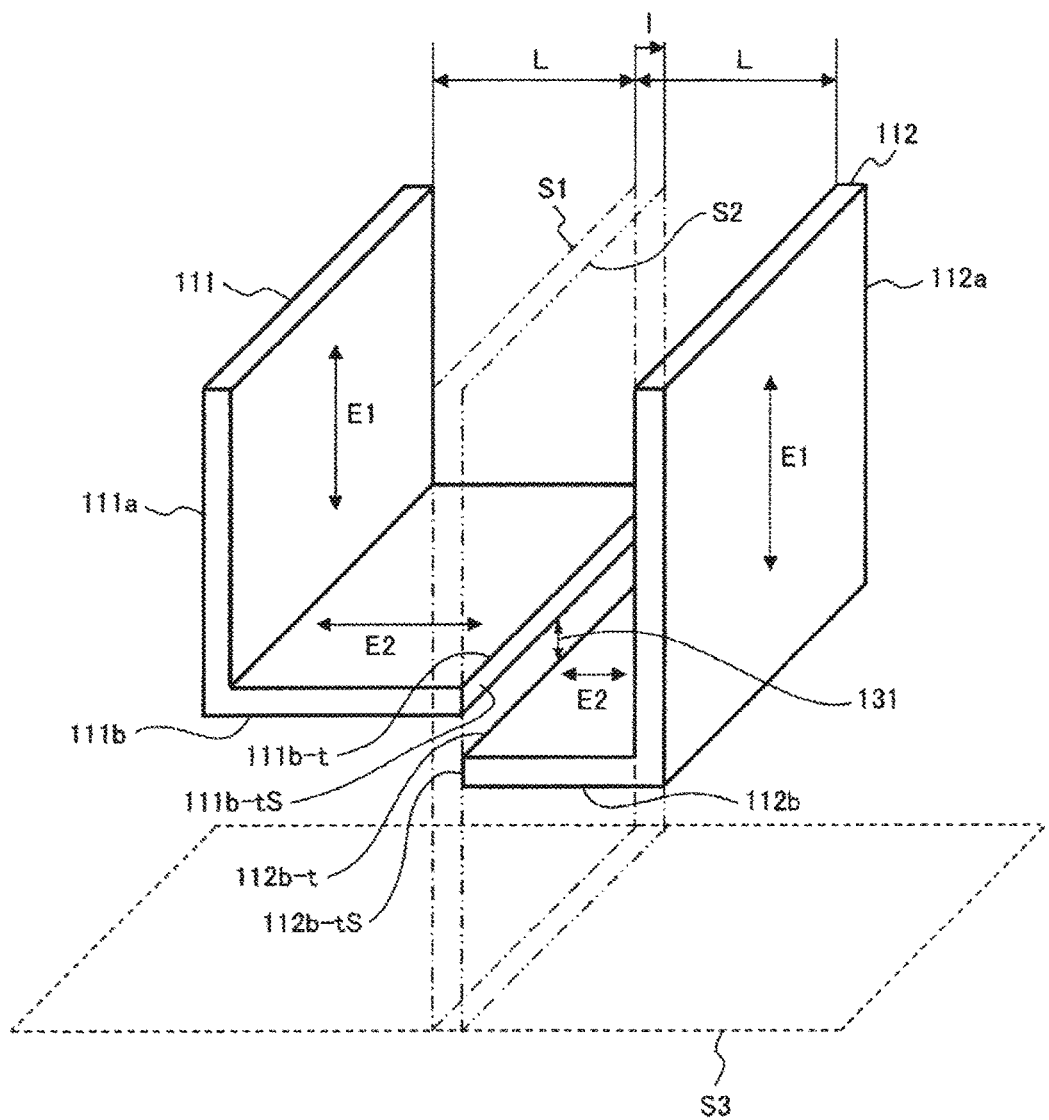
FIG. 15 is a diagram for describing an overlap structure according to the invention.

Herein, the description will be made using FIG. 15 about an overlapping structure of the one-side wall (bottom) 111b and the one-side wall (bottom) 112b. FIG. 15 is a diagram for describing the overlapping structure. Further, the hall element 113 and the conductor 121 are omitted from FIG. 15.

The gap 131 along the extending direction of the both-side walls 111a and 112a (a direction indicated by arrow E1) is provided between an end portion 111b-t of the one-side wall 111b and an end portion 112b-t of the one-side wall 112b, and is provided to have an overlapping amount of 0 or more mm. FIG. 15 illustrates a case where the overlapping amount is 0 mm. In other words, an end surface 111b-tS of the one-side wall 111*b* and an end surface 112*b*-tS of the one-side wall 112*b* are positioned on a virtual plane S2.

The virtual plane S2 is a plane in parallel to a virtual plane S1. The virtual plane S1 is a virtual plane located at an equal distance L from the both-side wall 111*a* and the both-side wall 112*a*. Further, the virtual plane S1 is a plane containing the straight line 141 of FIG. 1.

In FIG. 15, the virtual plane S2 containing the end surface 111*b*-tS of the one-side wall 111*b* and the end surface 112*b*-tS of the one-side wall 112*b* is offset by a distance 1 from the virtual plane S1, and the virtual plane S2 may be matched with the virtual plane S1.

While the overlapping amount in FIG. 15 is set to 0 mm, the overlapping amount is desirably set to a dimension larger than 0 mm. In other words, the one-side wall 111*b* and the one-side wall 112*b* are securely overlapped, and it is desirable that a disturbing magnetic flux does not reach the hall element 113.

When the end surface 111*b*-tS of the one-side wall 111*b* and the end surface 112*b*-tS of the one-side wall 112*b* are disposed on the virtual plane S2, and in a case where the one-side walls 111*b* and 112*b* are projected onto a virtual plane S3 which is perpendicular to the virtual plane S1 and parallel to the one-side walls 111*b* and 112*b*, the end portion 111*b*-*t* of the one-side wall 111*b* and the end portion 112*b*-*t* of the one-side wall 112*b* are matched to each other on the virtual plane S3, and there is no gap between the end portion 111*b*-*t* of the one-side wall 111*b* and the end portion 112*b*-*t* of the one-side wall 112*b*. The overlapping structure in this embodiment is targeted at the configuration in which no gap is generated between the end portion 111*b*-*t* and the end portion 112*b*-*t* when being projected onto the virtual plane S3, and also includes a case where the overlapping amount is 0 mm.

The end portion 111*b*-*t* of the one-side wall (protrusion portion) 111*b* and the end portion 112*b*-*t* of the one-side wall (protrusion portion) 112*b* are separated in a direction perpendicular to a protruding direction E2 of the one-side walls 111*b* and 112*b* and perpendicular to the extending direction of the conductor 121 so as to provide the gap 131. In other words, the end portion 111*b*-*t* and the end portion 112*b*-*t* are offset in a direction perpendicular to the protruding direction E2 of the one-side walls 111*b* and 112*b* and perpendicular to the extending direction of the conductor 121. In addition, the end portion 111*b*-*t* and the end portion 112*b*-*t* are overlapped in the protruding direction E2 of the one-side walls 111*b* and 112*b*.

Further, the invention is not limited to the above-described embodiments, and various modifications can be included. For example, the above embodiments are described in detail for the purpose of easily understanding the invention, and all the configurations are not necessarily provided. In addition, some of the configurations of a certain embodiment or modification may be replaced with the configurations of the other embodiments or modifications, and the configurations of the subject embodiment or modification may be added to the configurations of the other embodiments or modifications. In addition, some of the configurations of each embodiment or modification may be added, omitted, or replaced with other configurations.

REFERENCE SIGNS LIST 100, 100A, 100B, and 100C current detection device
111, 111A, 111B, and 111C first magnetic shield member
111*a* side wall of first magnetic shield member 111
111*b* bottom of first magnetic shield member 111
111*b*-*t* end portion of low portion 111*b*
111*b*-tS end surface of low portion 111*b*
112, 112A, 112B, and 112C second magnetic shield portion
112*a* side wall of second magnetic shield member 112
112*b* bottom of second magnetic shield member 112
112*b*-*t* end portion of low portion 112*b*
112*b*-tS end surface of low portion 112*b*
113, 113A, 113B, and 113C hall element
113*a* terminal of hall element 113
115 printed circuit board (substrate member)
116 resin (resin mold)
117 terminal of printed circuit board
121, 121A, 121B, 121C conductor
131, 131A, 131B, 131C gap
161A, 161B, 161C bolt hole
171 conductor causing disturbance
411 power conversion device
421 micro-controller
422 drive circuit
423 power module
424 capacitor
425 current detection device
426 conductor
427 terminal
428 motor

The invention claimed is:

1. A current detection device, comprising:
a substrate that extends along a plane that is formed by a first axis and a second axis;
a current sensor mounted on the substrate, wherein the current sensor extends away from the substrate along a third axis that is orthogonal to the first axis and the second axis;
a first magnet shield member that is mounted to the substrate and extends a first distance away from the substrate in a direction parallel to the third axis, where in the first magnet shield member includes a first protrusion portion that extends in a direction that is parallel to the first axis and the first protrusion portion intersects the third axis;
a second magnet shield member that is mounted to the substrate and extends a second distance away from the substrate in the direction parallel to the third axis, where in the second magnet shield member includes a second protrusion portion that extends in the direction that is parallel to the first axis and the second protrusion portion intersects the third axis;
an overlapping portion formed by the second protrusion overlapping the first protrusion portion and the second protrusion portion, wherein the overlapping portion intersects the third axis; and
a conductor that extends in the direction parallel to the first axis and intersects the third axis, wherein the conductor is a third distance along the third axis away from the substrate;
wherein the first magnetic shield member includes a facing-side wall that faces the second magnetic shield member with the conductor interposed therebetween,
wherein the second magnetic shield member includes a facing-side wall that faces the first magnetic shield member with the conductor interposed therebetween, and
wherein the second distance is greater than the first distance so that a gap along the third axis is formed between the overlapping portion of the first protrusion portion and the second portion.

2. The current detection device according to claim 1,
wherein the current sensor faces the overlapping portion between the first magnetic shield member and the second magnetic shield member, and the current sensor extends a fourth distance away from the substrate along the third axis; and
wherein the fourth distance is greater than the third distance.

3. The current detection device according to claim 2, wherein a first protruding length of the first protrusion portion of the first magnetic shield member is longer than a second protruding length of the second protrusion portion of the second magnetic shield member.

4. The current detection device according to claim 1,
wherein the conductor faces the overlapping portion between the first magnetic shield member and the second magnetic shield member, and the current sensor extends a fourth distance away from the substrate along the third axis; and
wherein the fourth distance is less than the third distance.

* * * * *